(12) United States Patent
Shi et al.

(10) Patent No.: US 11,011,477 B2
(45) Date of Patent: May 18, 2021

(54) HIGH-RELIABILITY ELECTRONIC PACKAGING STRUCTURE, CIRCUIT BOARD, AND DEVICE

(71) Applicant: Huawei Technologies Co., Ltd., Shenzhen (CN)

(72) Inventors: Hongbin Shi, Shanghai (CN); Runqing Ye, Shanghai (CN); Haohui Long, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/339,195

(22) PCT Filed: Mar. 30, 2017

(86) PCT No.: PCT/CN2017/078888
§ 371 (c)(1),
(2) Date: Apr. 3, 2019

(87) PCT Pub. No.: WO2018/126545
PCT Pub. Date: Jul. 12, 2018

(65) Prior Publication Data
US 2019/0311996 A1  Oct. 10, 2019

(30) Foreign Application Priority Data
Jan. 5, 2017  (CN) .......................... 201710007262.4

(51) Int. Cl.
*H01L 23/00* (2006.01)
*H01L 23/498* (2006.01)
(Continued)

(52) U.S. Cl.
CPC .......... *H01L 23/562* (2013.01); *H01L 23/488* (2013.01); *H01L 23/49838* (2013.01);
(Continued)

(58) Field of Classification Search
CPC ................ H01L 23/562; H01L 23/488; H01L 23/49838; H01L 23/49894; H01L 25/00
See application file for complete search history.

(56) References Cited

U.S. PATENT DOCUMENTS 6,762,495 B1    7/2004  Reyes et al.
9,780,071 B2 *  10/2017 Lee ..................... H01L 25/0652
(Continued)

FOREIGN PATENT DOCUMENTS

CN    1389914 A    1/2003
CN    1742371 A    3/2006
(Continued)

OTHER PUBLICATIONS

Machine Translation and Abstract of Chinese Publication No. CN1742371, Mar. 1, 2006, 15 pages.
(Continued)

*Primary Examiner* — Fernando L Toledo
*Assistant Examiner* — Valerie N Newton
(74) *Attorney, Agent, or Firm* — Conley Rose, P.C.

(57) ABSTRACT

A high-reliability electronic packaging structure includes a plurality of packaging layers and mechanical support layers. An electrically functional solder joint is provided in a first area of each of the packaging layers, and any two adjacent packaging layers are coupled using electrically functional solder joints. A mechanical support layer is disposed in a second area of each of the packaging layers, and the mechanical support layer is configured to support the two adjacent packaging layers. The first area is provided on a periphery of the second area. Hence, a problem that an internal silicon chip at an upper packaging layer or a lower packaging layer fractures and fails when the upper packaging layer or the lower packaging layer is subject to a mechanical load can be resolved.

19 Claims, 4 Drawing Sheets

(51) Int. Cl.
*H01L 23/488* (2006.01)
*H01L 25/00* (2006.01)
*B32B 27/38* (2006.01)

(52) U.S. Cl.
CPC ........ *H01L 23/49894* (2013.01); *H01L 25/00* (2013.01); *B32B 27/38* (2013.01)

(56) References Cited

U.S. PATENT DOCUMENTS

| | | | |
|---|---|---|---|
| 9,881,908 B2 * | 1/2018 | Lin | .......................... H01L 24/19 |
| 2008/0157327 A1 * | 7/2008 | Yang | ..................... H01L 25/105 |
| | | | 257/686 |
| 2009/0127688 A1 | 5/2009 | Lee et al. | |
| 2012/0299173 A1 * | 11/2012 | Mohammed | ........ H01L 23/3677 |
| | | | 257/686 |
| 2012/0299197 A1 | 11/2012 | Kwon et al. | |
| 2017/0294423 A1 | 10/2017 | Wu | |
| 2019/0029113 A1 | 1/2019 | Kyozuka | |

FOREIGN PATENT DOCUMENTS

| | | |
|---|---|---|
| CN | 101071779 A | 11/2007 |
| CN | 101425510 A | 5/2009 |
| CN | 103247547 A | 8/2013 |
| JP | 2000133668 A | 5/2000 |
| JP | 2016046418 A | 4/2016 |

OTHER PUBLICATIONS

Machine Translation and Abstract of Chinese Publication No. CN101425510, May 6, 2009, 16 pages.
Foreign Communication From a Counterpart Application, PCT Application No. PCT/CN2017/078888, English Translation of International Search Report dated Oct. 10, 2017, 2 pages.
Machine Translation and Abstract of Chinese Publication No. CN101071779, Nov. 14, 2007, 17 pages.
Foreign Communication From a Counterpart Application, Chinese Application No. 201780005368.9, Chinese Office Action dated Jun. 27, 2019, 7 pages.
Machine Translation and Abstract of Japanese Publication No. JP2000133668, May 12, 2000, 12 pages.
Foreign Communication From a Counterpart Application, Korean Application No. 10-2018-7032994, Korean Office Action dated Dec. 16, 2019, 5 pages.
Foreign Communication From a Counterpart Application, Korean Application No. 10-2018-7032994, English Translation of Korean Office Action dated Dec. 26, 2019, 6 pages.
Foreign Communication From a Counterpart Application, Japanese Application No. 2018-562580, Japanese Office Action dated Dec. 17, 2019, 4 pages.
Foreign Communication From a Counterpart Application, Japanese Application No. 2018-562580, English Translation pf Japanese Office Action dated Dec. 17, 2019, 4 pages.

* cited by examiner

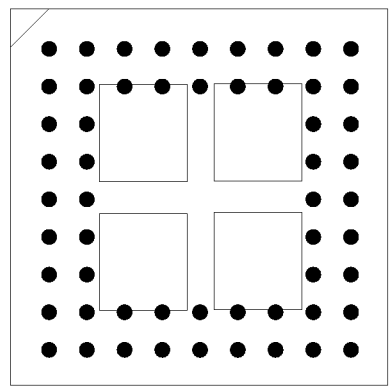
FIG. 1(a-1)
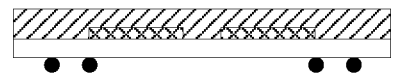
FIG. 1(a-2)
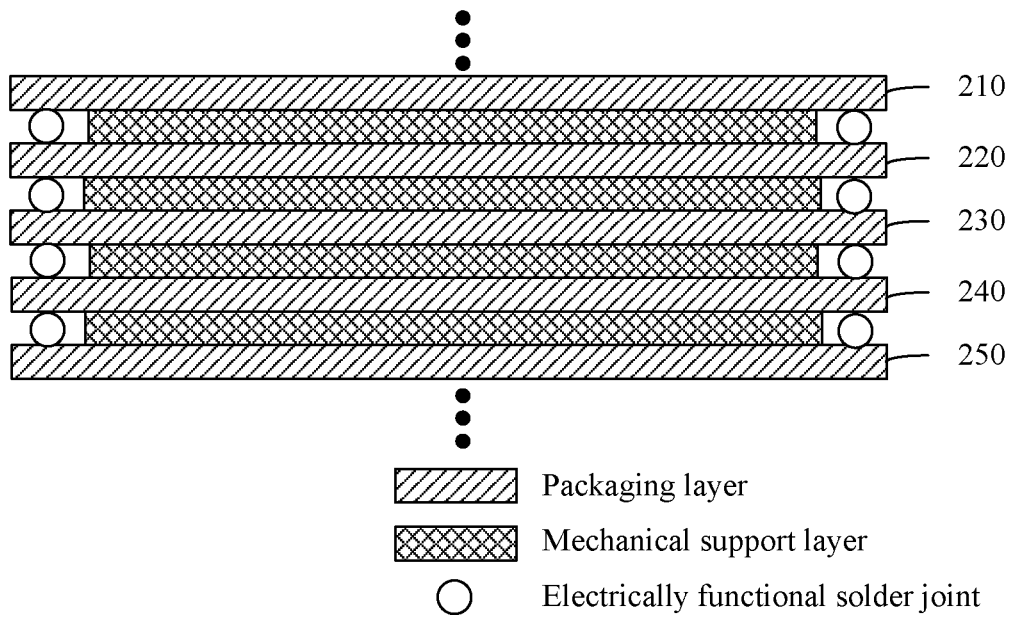
FIG. 2

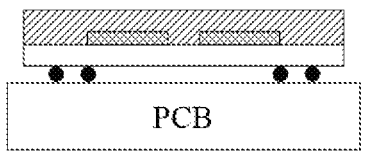 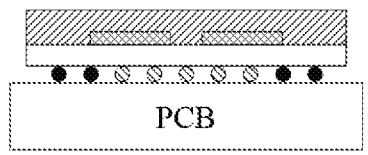 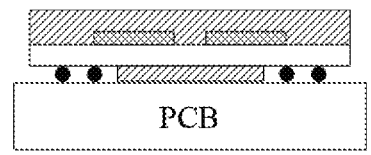
FIG. 7(a)        FIG. 7(b)        FIG. 7(c)
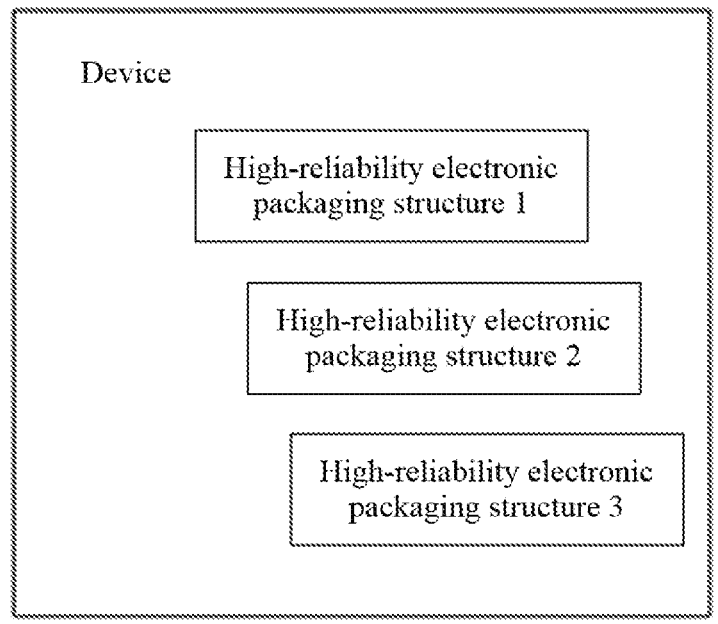
FIG. 8

HIGH-RELIABILITY ELECTRONIC PACKAGING STRUCTURE, CIRCUIT BOARD, AND DEVICE

CROSS-REFERENCE TO RELATED APPLICATIONS

This application is a U.S. National Stage of International Patent Application No. PCT/CN2017/078888 filed on Mar. 30, 2017 which claims priority to Chinese Patent Application No. 201710007262.4 filed on Jan. 5, 2017. Both of the aforementioned applications are hereby incorporated by reference in their entireties.

TECHNICAL FIELD

The present invention relates to the field of electronic boards, and in particular, to a high-reliability electronic packaging structure, a circuit board, and a device.

BACKGROUND

To meet a requirement of a portable and wearable device for a small, light, and thin electronic packaging component, an application processor (Application Processor, AP) and a memory are stacked together by using a package on package (Package on Package, PoP). The solution is more widely applied. The POP, as an electronic element having a largest size in terminal products, is confronted with a severe mechanical and environmental reliability risk, such as a fracture or a failure of an intermetallic compound (Intermetallic Compound, IMC) or a lead of a board-level solder joint (between the POP and a main board) during a dropping shock and with a cyclic temperature load (as shown in FIG. 2).

In the prior art, to improve reliability of the POP with a dropping load, a bending load, a cyclic temperature load, and the like, an underfill (underfill) material is widely used to protect a board-level solder joint. The underfill may be used to relatively evenly distribute, to all solder joints, mechanical stress and thermal stress originally concentrated on a solder joint in a corner of an element, thereby improving overall reliability of the POP. To improve a filling speed of and reworkability of the underfill, a low-viscosity underfill without a filler (filler) is usually selected for a current board-level underfill. Consequently, when the underfill is used between a POP lower packaging layer and a printed circuit board (Printed circuit board, PCB), the underfill overflows from an edge of dispensed glue to a local area between the POP lower layer and an upper packaging layer. In this case, when the POP is subject to a mechanical load, concentrated stress is generated at an edge position of overflowing glue. Consequently, a fracture of a silicon chip at the upper packaging layer is finally caused.

SUMMARY

Embodiments of the present invention relate to a high-reliability electronic packaging structure, a circuit board, and a device, to resolve, by using a POP upper packaging structure and a POP lower packaging structure, a problem that an internal silicon chip at a POP upper packaging layer fractures and fails because the POP upper packaging layer is locally filled.

According to a first aspect, an embodiment of the present invention provides a high-reliability electronic packaging structure. The high-reliability electronic packaging structure includes a plurality of packaging layers and mechanical support layers. An electrically functional solder joint is provided in a first area of each of the plurality of packaging layers, and any two adjacent packaging layers are connected by using electrically functional solder joints. A mechanical support layer is disposed in a second area of each of the plurality of packaging layers, and the mechanical support layer is configured to support the two adjacent packaging layers. The first area is provided on a periphery of the second area.

In this embodiment of the present invention, mechanical support layers are disposed in second areas of any adjacent packaging layers of the plurality of packaging layers. Therefore, deformation generated when the plurality of packaging layers are mechanically deformed is reduced, so as to resolve a problem that an internal silicon chip at a packaging layer fractures and fails.

In a possible embodiment, the mechanical support layer is disposed on an upper surface or a lower surface of each packaging layer. This resolves a problem that an internal silicon chip at a packaging layer fractures and fails.

In a possible embodiment, the mechanical support layer includes a dummy solder ball or an epoxy mold compound.

According to a second aspect, an embodiment of the present invention provides a circuit board. The circuit board includes a PCB board, an electronic part, and a mechanical support layer. The PCB board is connected, by using a pad provided in a first area of the PCB board, to an electrically functional solder joint provided in a first area of the electronic part. The mechanical support layer is disposed in a second area of the electronic part. The first area is provided on a periphery of the second area.

In this embodiment of the present invention, the mechanical support layer is disposed in the second area of the electronic part. Therefore, deformation generated when a plurality of packaging layers are mechanically deformed is reduced, so as to resolve a problem that an internal silicon chip at a packaging layer fractures and fails.

According to a third aspect, an embodiment of the present invention provides a device. The device includes the high-reliability electronic packaging structure described above.

Compared with the prior art, the technical solutions provided in the embodiments of the present invention can resolve a problem that an internal silicon chip at a POP upper packaging layer or a POP lower packaging layer fractures and fails when the POP upper packaging layer or the POP lower packaging layer is subject to a mechanical load.

BRIEF DESCRIPTION OF DRAWINGS

FIG. 1(a-1) and FIG. 1(a-2) are schematic structural diagrams of electronic packaging in the prior art;

FIG. 2 is a schematic structural diagram of a first high-reliability electronic packaging structure according to an embodiment of the present invention;

FIG. 7(a) to FIG. 7(c) are schematic structural diagrams of a circuit board; and FIG. 8 is a schematic structural diagram of a device according to an embodiment of the present invention.

DESCRIPTION OF EMBODIMENTS

Figure 3A:
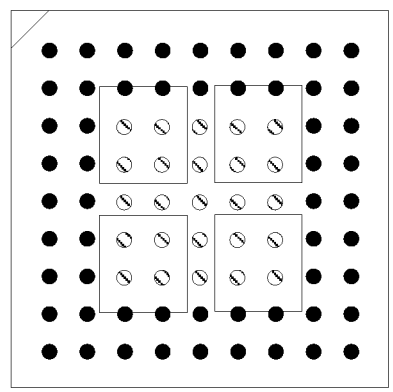
FIG. 3(a) and FIG. 3(b) are schematic structural diagrams of a second high-reliability electronic packaging structure according to an embodiment of the present invention.

The terms used in the embodiments of the present invention are merely for the purpose of describing specific embodiments, and are not intended to limit the embodiments of the present invention. The terms "a", "said" and "the" of singular forms used in the embodiments and the claims of the present invention are also intended to include plural forms, unless otherwise specified in the context clearly. It should also be understood that the term "and/or" used in this specification indicates and includes any or all possible combinations of one or more associated listed items. The character "/" in this specification usually indicates an "or" relationship between the associated objects.

FIG. 2 is a schematic structural diagram of a high-reliability electronic packaging structure according to an embodiment of the present invention. As shown in FIG. 2, the high-reliability electronic packaging structure includes a plurality of packaging layers and a support layer. The plurality of packaging layers include at least two packaging layers. An electrically functional solder joint is provided in a first area of each of the plurality of packaging layers, and any two adjacent packaging layers are connected by using electrically functional solder joints. A mechanical support layer is disposed in a second area of each of the plurality of packaging layers, and the mechanical support layer is configured to support the two adjacent packaging layers. The first area is provided on a periphery of the second area. A packaging layer 210, a packaging layer 220, a packaging layer 230, a packaging layer 240, a packaging layer 250, and four mechanical support layers are used as an example in FIG. 2.

Specifically, electrically functional solder joints are provided in first areas of the packaging layer 210, the packaging layer 220, the packaging layer 230, the packaging layer 240, and the packaging layer 250. The electrically functional solder joints are separately used to connect the packaging layer 210 and the packaging layer 220, connect the packaging layer 220 and the packaging layer 230, connect the packaging layer 230 and the packaging layer 240, and connect the packaging layer 240 and the packaging layer 250. Mechanical support layers are disposed in second areas of the packaging layer 210, the packaging layer 220, the packaging layer 230, the packaging layer 240, and the packaging layer 250. The first area is provided on the periphery of the second area. The electrically functional solder joint is used to implement an electrical connection between the plurality of packaging layers, in other words, to implement a physical connection. A signal is transmitted between the plurality of packaging layers.

In a possible embodiment, the first area is located on an upper surface or a lower surface of each of the plurality of packaging layers.

The packaging layer 210 and the packaging layer 220 are used as an example for description. Specifically, a first area of the packaging layer 210 is provided on a lower surface of the packaging layer 210, a first area of the packaging layer 220 is provided on an upper surface of the packaging layer 220, and the first area of the packaging layer 210 corresponds to the first area of the packaging layer 220.

In a possible embodiment, the mechanical support layer includes a non-electrically functional solder joint or an epoxy mold compound.

It should be noted that the mechanical support layer may be equivalently replaced by using the non-electrically functional solder joint, the epoxy mold compound, or another structure or material that has a same principle. The non-electrically functional solder joint corresponds to the electrically functional solder joint, and the non-electrically functional solder joint is configured to support any two packaging layers. The non-electrically functional solder joint may be a dummy solder joint (Dummy ball) or an epoxy mold compound (Epoxy Mold Compound, EMC).

In a possible embodiment, each of the plurality of packaging layers is in a regular shape. For example, each of the plurality of packaging layers is in a square shape. The first area is located around each of the plurality of packaging layers, and the second area is a central area of each of the plurality of packaging layers.

In a possible embodiment, the high-reliability electronic packaging structure includes two packaging layers, such as an upper packaging layer and a lower packaging layer.

In a possible embodiment, for the upper packaging layer, the mechanical support layer is disposed on a lower surface of the upper packaging layer.

In a possible embodiment, the mechanical support layer is a dummy ball.

Figure 3B:
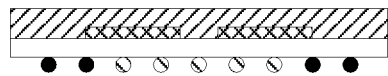

Specifically, the dummy ball is provided in a first area on the lower surface of the upper packaging layer. Therefore, deformation caused to the upper packaging layer when the upper packaging layer is subject to a mechanical load is reduced, so as to resolve a problem that an internal silicon chip at the upper packaging layer fractures and fails. Details are shown in FIG. 3(a) and FIG. 3(b). FIG. 3(a) is a bottom view of the upper packaging layer, and FIG. 3(b) is a side view of the upper packaging layer.

In this embodiment of the present invention, mechanical support is increased by adding the dummy ball to the first area on the lower surface of the upper packaging layer. Therefore, the deformation generated when the upper packaging layer is subject to the mechanical load is reduced, so as to resolve the problem that the internal silicon chip at the upper packaging layer fractures and fails.

Feasibility of this embodiment of the present invention is described in terms of a process. The dummy ball and an electrically functional solder joint that is provided in the first area of the upper packaging layer may be simultaneously soldered onto a substrate (substrate) of the upper packaging layer. In comparison with the prior art, no additional process step is added, but only a dummy pad (Dummy pad) needs to be added to a corresponding position on an upper surface of the lower packaging layer.

To verify an improvement effect of this embodiment of the present invention, a finite element analysis may be performed on a stress level of the upper packaging layer when the upper packaging layer is subject to a mechanical load in this embodiment of the present invention and in a solution of the prior art. It is assumed that a load condition of the finite element analysis is 50 N.

The following table shows stress (MPa) of the upper packaging layer when the upper packaging layer is subject to a mechanical load in this embodiment of the present invention and in the solution of the prior art.

| | Stress (MPa) of the upper packaging layer | | | |
|---|---|---|---|---|
| | Upper surface | | Lower surface | |
| Prior art | 400.8 | 100% | 227.1 | 56.7% |
| Dummy ball | 101.8 | 25.4% | 76.2 | 19.0% |

| | Stress (MPa) of the upper packaging layer | | | |
|---|---|---|---|---|
| | Upper surface | | Lower surface | |
| Original design | 400.8 | 100% | 227.1 | 56.7% |
| Dummy EMC | 16.2 | 4.0% | 10.1 | 2.5% |

It may be learned from the foregoing table that upper stress of the upper packaging layer is reduced by 74.6% in this embodiment of the present invention compared with that in the prior art.

In this embodiment of the present invention, when the upper packaging layer is subject to the mechanical load, a stress analysis may be performed on any area of the upper packaging layer. For example, the stress analysis may be performed on an upper left corner of the upper packaging layer. When the upper packaging layer is filled with an underfill, the upper left corner of the upper packaging layer is also filled with the underfill. Therefore, the stress analysis may be performed on the upper left corner of the upper packaging layer.

It should be noted that a process of the finite element analysis belongs to the prior art. Moreover, any analysis having a same function as the finite element analysis may be used for equivalent replacement.

In this embodiment of the present invention, a dummy ball is added to a second area on the lower surface of the upper packaging layer. Therefore, the deformation generated when the upper packaging layer is subject to the mechanical load can be reduced. If glue overflows at the upper packaging layer, stress near an edge of the overflowing glue is also apparently reduced, so as to resolve the problem that the internal silicon chip at the upper packaging layer fractures and fails.

Figure 4A:
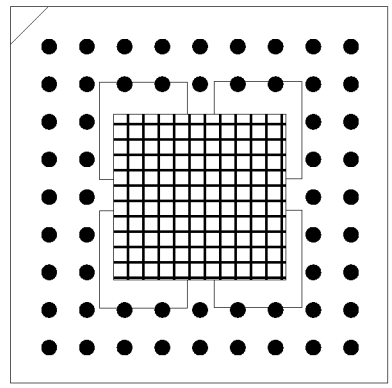
FIG. 4(a) and FIG. 4(b) are schematic structural diagrams of a third high-reliability electronic packaging structure according to an embodiment of the present invention.
Figure 4B:

In a possible embodiment, the mechanical support layer is an EMC. To distinguish the EMC from an EMC on the upper surface of the upper packaging layer, the mechanical support layer is referred to as a dummy EMC below. Details are shown in FIG. 4(a) and FIG. 4(b). FIG. 4(a) is a bottom view of the upper packaging layer, and FIG. 4(b) is a side view of the upper packaging layer.

Specifically, the dummy EMC is provided in the second area on the lower surface of the upper packaging layer. Therefore, deformation caused to the upper packaging layer when the upper packaging layer is subject to a mechanical load is reduced, so as to resolve a problem that an internal silicon chip at the upper packaging layer fractures and fails.

Feasibility of this embodiment of the present invention is described in terms of a process. The dummy EMC and the EMC that is on the upper surface of the upper packaging layer may be simultaneously or separately molded onto a packaging substrate (substrate) of the upper packaging layer. Compared with the prior art, this embodiment of the present invention requires no additional process step.

To verify an improvement effect of this embodiment of the present invention, a finite element analysis may be performed on a stress level of the upper packaging layer when the upper packaging layer is subject to a mechanical load in this embodiment of the present invention and in a solution of the prior art. It is assumed that a load condition of the finite element analysis is 50 N.

The following table shows stress (MPa) of the upper packaging layer when the upper packaging layer is subject to a mechanical load in this embodiment of the present invention and in the solution of the prior art.

It may be learned from the foregoing table that stress of the upper surface of the upper packaging layer is reduced by 96% in this embodiment of the present invention compared with that of the prior art.

In this embodiment of the present invention, a dummy EMC is added to the second area on the lower surface of the upper packaging layer. Therefore, the deformation generated when the upper packaging layer is subject to the mechanical load can be reduced. If glue overflows at the upper packaging layer, stress near an edge of the overflowing glue is also apparently reduced, so as to resolve the problem that the internal silicon chip at the upper packaging layer fractures and fails. In addition, compared with point support of the dummy ball, surface support of the dummy EMC may more apparently reduce the stress of the upper packaging layer. In addition, compared with the point support of the dummy ball, the surface support of the dummy EMC may prevent an underfill from flowing to an area, in which there is no solder joint, on the upper packaging layer, to reduce a glue overflowing area. This ensures a height of an underfill fillet on a periphery of the upper surface of the lower packaging layer, so as to improve quality stability of a glue dispensing process in a gap of the lower packaging layer, and avoid problems of a void (void), lamination, and other disadvantages on a lower surface.

In a possible embodiment, for the lower packaging layer, the mechanical support layer is disposed on the upper surface of the lower packaging layer.

Specifically, the mechanical support layer is disposed in a second area on the upper surface of the lower packaging layer.

Figure 5A:
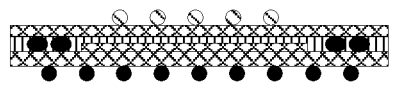
FIG. 5(a) to FIG. 5(d) are schematic structural diagrams of a fourth high-reliability electronic packaging structure according to an embodiment of the present invention.
Figure 5B:
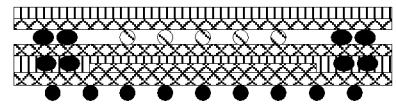
Figure 5C:
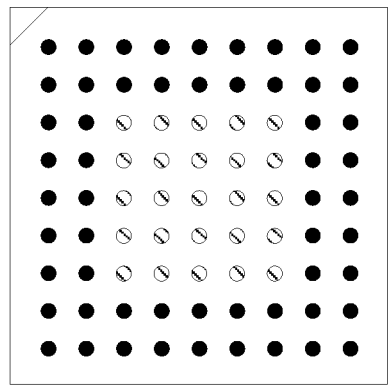
Figure 5D:
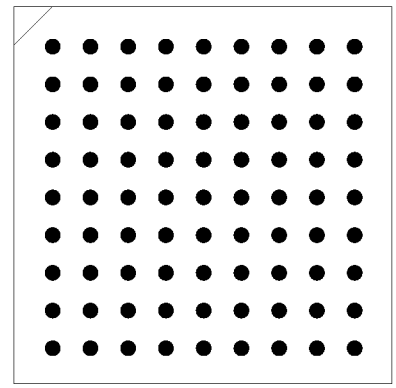

In a possible embodiment, the mechanical support layer is a dummy ball. Details are shown in FIG. 5(a) to FIG. 5(d). FIG. 5(a) is a side view of the lower packaging layer, FIG. 5(b) is a side view, FIG. 5(c) is a top view of the lower packaging layer, and FIG. 5(d) is a bottom view of the lower packaging layer.

Specifically, the dummy ball is provided in the second area on the upper surface of the lower packaging layer. Therefore, deformation caused to the upper packaging layer when the upper packaging layer is subject to a mechanical load is reduced, so as to resolve a problem that an internal silicon chip at the upper packaging layer fractures and fails.

In this embodiment of the present invention, mechanical support is increased by adding the dummy ball to the second area on the upper surface of the lower packaging layer. Therefore, the deformation generated when the upper packaging layer is subject to the mechanical load is reduced, so as to resolve the problem that the internal silicon chip at the upper packaging layer fractures and fails.

Feasibility of this embodiment of the present invention is described in terms of a process. The dummy ball may be soldered onto a dummy pad in an upper portion of a transfer board of the lower packaging layer in a reflow (reflow) soldering manner. The dummy pad corresponding to the dummy ball is added to a corresponding position on the lower surface of the upper packaging layer, so that the upper packaging layer and the lower packaging layer are packaged to form a dummy solder joint (dummy solder joint). The dummy solder joint is a solder joint soldered onto a PCB board, but is not connected to a specific electronic device.

In this embodiment of the present invention, the dummy ball is added to the second area on the lower packaging layer. Therefore, the deformation generated when the upper packaging layer is subject to the mechanical load can be reduced. If glue overflows at the upper packaging layer, stress near an edge of the overflowing glue is also apparently reduced, so as to resolve the problem that the internal silicon chip at the upper packaging layer fractures and fails.

Figure 6A:
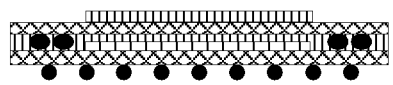
FIG. 6(a) to FIG. 6(d) are schematic structural diagrams of a fifth high-reliability electronic packaging structure according to an embodiment of the present invention.
Figure 6B:
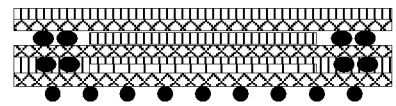
Figure 6C:
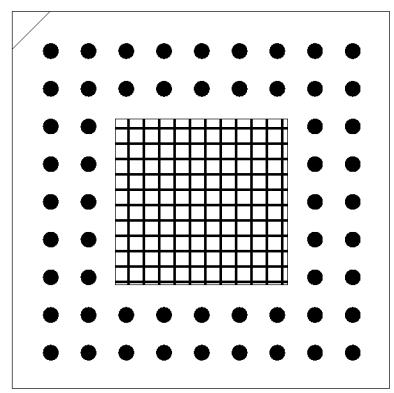
Figure 6D:
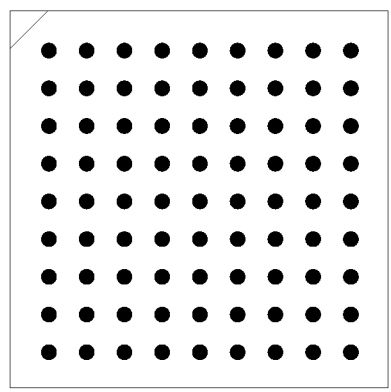

In a possible embodiment, the mechanical support layer is a dummy EMC. Details are shown in FIG. 6(a) to FIG. 6(d). FIG. 6(a) is a side view of the lower packaging layer, FIG. 6(b) is a side view, FIG. 6(c) is a top view of the lower packaging layer, and FIG. 6(d) is a bottom view of the lower packaging layer.

Specifically, the dummy EMC is provided in the second area on the upper surface of the lower packaging layer. Therefore, deformation caused to the upper packaging layer when the upper packaging layer is subject to a mechanical load is reduced, so as to resolve a problem that an internal silicon chip at the upper packaging layer fractures and fails.

Feasibility of this embodiment of the present invention is described in terms of a process. The dummy EMC and the EMC that is in an intermediate packaging portion of the lower packaging layer may be simultaneously or separately molded (molding) onto a transfer board of the lower packaging layer.

In this embodiment of the present invention, the dummy EMC is added to the second area on the upper surface of the lower packaging layer. Therefore, the deformation generated when the upper packaging layer is subject to the mechanical load can be reduced. If glue overflows at the upper packaging layer, stress near an edge of the overflowing glue is also apparently reduced, so as to resolve the problem that the internal silicon chip at the upper packaging layer fractures and fails. In addition, compared with point support of the dummy ball, surface support of the dummy EMC may more apparently reduce the stress of the upper packaging layer. In addition, compared with the point support of the dummy ball, the surface support of the dummy EMC may prevent an underfill from flowing to an area, in which there is no solder joint, on the upper packaging layer, to reduce a glue overflowing area. This ensures a height of an underfill fillet on a periphery of the upper surface of the lower packaging layer, so as to improve quality stability of a glue dispensing process in a gap of the lower packaging layer, and avoid problems of a void, lamination, and other disadvantages on a lower surface.

It should be noted that the mechanical support layer may be equivalently replaced by using the dummy ball, the dummy EMC, or another structure or material that has a same principle.

In this embodiment of the present invention, the dummy ball and the dummy EMC have a wider heat dissipation channel compared with a conventional POP. Heat generated by a conventional POP lower packaging layer can be conducted to the upper packaging layer only by using limited peripheral solder joints between the upper packaging layer and the lower packaging layer. Based on this, the dummy ball and the dummy EMC that are provided in this embodiment of this application may also be used as a channel that conducts heat from the lower packaging layer to the upper packaging layer.

FIG. 7(a) to FIG. 7(c) are schematic structural diagrams of a circuit board. As shown in FIG. 7(a) to FIG. 7(c), the circuit board includes a PCB board 710, a mechanical support layer 720, and an electronic part 730.

Specifically, the PCB board is connected, by using a pad provided in a first area of the PCB board, to an electrically functional solder joint provided in a first area of the electronic part. The mechanical support layer is disposed in a second area of the electronic part. The first area is provided on a periphery of the second area.

In a possible embodiment, the electronic part may be a single-layer ball grid array (Ball Grid Array, BGA) surrounded by solder joints, or may be provided with the mechanical support layer in a central area. For details, refer to FIG. 7(a) to FIG. 7(c). No mechanical support layer is disposed in FIG. 7(a), a dummy ball is provided in FIG. 7(b), and a dummy EMC is provided in FIG. 7(c). Therefore, a problem that an internal silicon chip of the BGA fractures and fails can be resolved.

It should be noted that a first area of the BGA is a periphery of the BGA, and a second area is a central area of the BGA.

In this embodiment of the present invention, the mechanical support layer is disposed in the second area of the electronic part. Therefore, deformation generated when a plurality of packaging layers are mechanically deformed is reduced, so as to resolve a problem that an internal silicon chip at a packaging layer fractures and fails.

FIG. 8 shows a device according to an embodiment of the present invention. The device includes the high-reliability electronic packaging structure provided in FIG. 1 to FIG. 6. Three high-reliability electronic packaging structures are only used as an example in FIG. 8 for description.

In a possible embodiment, the high-reliability electronic packaging structure is soldered onto a printed circuit board, and may be applied to a portable device, for example, a mobile phone.

The technical solutions of the present invention have the following effects:

1. Mechanical support for the upper packaging layer is enhanced by using the dummy ball or the dummy EMC, to reduce a risk that the internal silicon chip at the upper packaging layer fractures and fails when the upper packaging layer is subject to an external load. In addition, in the dummy EMC solution, an effect similar to complete filling may be formed between the upper packaging layer and the lower packaging layer before glue dispensing, to reduce a possibility that the underfill overflows upward to a gap between the upper packaging layer and the lower packaging layer.

2. The dummy ball and the dummy EMC, especially an EMC having high heat conductivity may be used to expand the heat dissipation channel from the lower packaging layer to the upper packaging layer, thereby improving heat dissipation, an electrical property, and thermal/mechanical reliability.

3. The dummy ball may further share mechanical/thermal stress applied to a peripheral function solder joint between the lower packaging layer and the upper packaging layer. Therefore, reliability of the peripheral solder joint between the lower packaging layer and the upper packaging layer is improved.

4. The dummy EMC forms a symmetrical structure on two sides, that is, an upper side and a lower side of the substrate of the lower packaging layer or the transfer board of the upper packaging layer. This helps improve a warpage (Warpage) of the lower packaging layer and the upper packaging layer caused by a difference between coefficients of thermal expansion (Coefficient of Thermal Expansion, CTE) of various materials in package and increase an assembly yield closely related to the warpage.

A person of ordinary skill in the art may understand that all or some of the steps of the method in any foregoing embodiment may be implemented by a program instructing related hardware. The program may be stored in a readable storage medium of a device, such as a flash or an EEPROM. When the program runs, the program executes all or some of the steps described above.

In the foregoing specific implementations, the objective, technical solutions, and benefits of the present invention are further described in detail. It should be understood that the foregoing descriptions are merely specific implementations of the present invention, but are not intended to limit the protection scope of the present invention. Any modification, equivalent replacement, or improvement made without departing from the spirit and principle of the present invention shall fall within the protection scope of the present invention.

What is claimed is:

1. A high-reliability electronic packaging structure, comprising:
    a first packaging layer, comprising:
    a first area; and
    a second area, wherein the first area of the first packaging layer surrounds a periphery of the second area of the first packaging layer;
    a first plurality of electrically functional solder joints positioned on a surface of the first area of the first packaging layer, wherein the first plurality of electrically functional solder joints are dispersed throughout the surface of the first area of the first packaging layer;
    a first mechanical support layer positioned on a surface of the second area of the first packaging layer, wherein the first mechanical support layer is dispersed throughout a surface of the second area of the first packaging layer, and wherein first mechanical support layer is configured to provide heat dissipation through the electronic packaging structure;
    a second packaging layer positioned on a surface of the first mechanical support layer opposite to the surface and the first area of the first packaging layer and the surface of the second area of the first packaging layer, wherein the second packaging layer comprises:
    a first area; and
    a second area, wherein the first area of the second packaging layer surrounds a periphery of the second area of the second packaging layer;
    a second plurality of electrically functional solder joints positioned on top of a surface of the first area of the second packaging layer, wherein the second plurality of electrically functional solder joints are dispersed throughout the surface of the first area of the second packaging layer, and wherein the first plurality of electrically functional solder joints are configured to couple the first packaging layer to the second packaging layer; and
    a second mechanical support layer positioned on a surface of the second area of the second packaging layer, wherein the second mechanical support layer is dispersed throughout the surface of the second area of the second packaging layer, wherein second mechanical support layer is configured to provide heat dissipation through the electronic packaging structure, and wherein the first mechanical support layer is configured to support the first packaging and the second packaging layer.

2. The high-reliability electronic packaging structure of claim 1, wherein the first mechanical support layer and the second mechanical support layer comprise a plurality of non-electrically functional solder joints.

3. The high-reliability electronic packaging structure of claim 1, wherein the first mechanical support layer and the second mechanical support layer comprise an epoxy mold compound.

4. The high-reliability electronic packaging structure of claim 1, wherein the first mechanical support layer and the second mechanical support layer comprise a plurality of dummy solder joints.

5. The high-reliability electronic packaging structure of claim 1, wherein the surface of the first area of the first packaging layer and the surface of the second area of the first packaging layer is an upper surface or a lower surface of the first packaging layer.

6. The high-reliability electronic packaging structure of claim 1, wherein the surface of the first area of the second packaging layer and the surface of the second area of the second packaging layer is an upper surface or a lower surface of the second packaging layer.

7. The high-reliability electronic packaging structure of claim 1, wherein the first packaging layer and the second packaging layer have a square shape.

8. A circuit board, comprising:
    an electronic part;
    a printed circuit board (PCB) comprising:
    a first area; and
    a second area, wherein the first area surrounds a periphery of the second area;
    a plurality of electrically functional solder joints positioned on a surface of the first area, wherein the plurality of electrically functional solder joints are dispersed throughout the surface of the first area; and
    a mechanical support layer positioned on a surface of the second area, wherein the mechanical support layer is dispersed throughout the surface of the second area of the first packaging layer, and wherein the mechanical support layer is configured to provide heat dissipation through the circuit board.

9. The circuit board of claim 8, wherein the mechanical support layer comprises a plurality of dummy solder joints.

10. The circuit board of claim 8, wherein the mechanical support layer comprises an epoxy mold compound.

11. The circuit board of claim 8, wherein the electronic part is single-layer ball grid array (BGA).

12. A device, comprising:
    a high-reliability electronic packaging structure, comprising:
    a first packaging layer, comprising:
    a first area; and
    a second area, wherein the first area of the first packaging layer surrounds a periphery of the second area of the first packaging layer;
    a first plurality of electrically functional solder joints positioned on a surface of the first area of the first packaging layer, wherein the first plurality of electrically functional solder joints are dispersed throughout the surface of the first area of the first packaging layer;
    a first mechanical support layer positioned on a surface of the second area of the first packaging layer, wherein the first mechanical support layer is dispersed throughout a surface of the second area of the first packaging layer, and wherein the first mechanical support layer is configured to provide heat dissipation through the electronic packaging structure;

a second packaging layer positioned on a surface of the first mechanical support layer opposite to the surface and the first area of the first packaging layer and the surface of the second area of the first packaging layer, wherein the second packaging layer comprises:
   a first area; and
   a second area, wherein the first area of the second packaging layer surrounds a periphery of the second area of the second packaging layer;

a second plurality of electrically functional solder joints positioned on top of a surface of the first area of the second packaging layer, wherein the second plurality of electrically functional solder joints are dispersed throughout the surface of the first area of the second packaging layer, and wherein the first plurality of electrically functional solder joints are configured to couple the first packaging layer to the second packaging layer; and a second mechanical support layer positioned on a surface of the second area of the second packaging layer, wherein the second mechanical support layer is dispersed throughout the surface of the second area of the second packaging layer, wherein second mechanical support layer is configured to provide heat dissipation through the electronic packaging structure.

13. The device of claim 12, wherein the first mechanical support layer and the second mechanical support layer comprise a plurality of non-electrically functional solder joints.

14. The device of claim 12, wherein the first mechanical support layer and the second mechanical support layer comprise an epoxy mold compound.

15. The device of claim 12, wherein the first mechanical support layer and the second mechanical support layer comprise a plurality of dummy solder joints.

16. The device of claim 12, wherein the surface of the first area of the first packaging layer and the surface of the second area of the first packaging layer is an upper surface or a lower surface of the first packaging layer.

17. The device of claim 12, wherein the surface of the first area of the second packaging layer and the surface of the second area of the second packaging layer is an upper surface or a lower surface of the second packaging layer.

18. The device of claim 12, wherein the first packaging layer and the second packaging layer have a square shape.

19. The device of claim 12, wherein the first mechanical support layer is configured to support the first packaging layer and the second packaging layer.

* * * * *